(12) United States Patent
Hente et al.

(10) Patent No.: US 8,283,849 B2
(45) Date of Patent: Oct. 9, 2012

(54) SEGMENTED ELECTROLUMINESCENT DEVICE WITH RESISTIVE INTERCONNECT LAYERS

(75) Inventors: Dirk Hente, Wuerselen (DE); Volker Van Elsbergen, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/265,230

(22) PCT Filed: Apr. 19, 2010

(86) PCT No.: PCT/IB2010/051695
§ 371 (c)(1),
(2), (4) Date: Oct. 19, 2011

(87) PCT Pub. No.: WO2010/125493
PCT Pub. Date: Nov. 4, 2010

(65) Prior Publication Data
US 2012/0049725 A1     Mar. 1, 2012

(30) Foreign Application Priority Data

Apr. 23, 2009 (EP) .................................. 09158554

(51) Int. Cl.
*H05B 33/02* (2006.01)
(52) U.S. Cl. .................. 313/503; 313/506; 313/509

(58) Field of Classification Search .................. 257/40, 257/72, 98–100, 642–643, 759; 313/498–512; 315/169.1, 169.3; 427/58, 64, 66, 532–535, 427/539; 428/690–691, 917; 438/26–29, 438/34, 82, 455; 445/24–25
See application file for complete search history.

(56) References Cited

FOREIGN PATENT DOCUMENTS

| GB | 2416621 A1 | 2/2006 |
|---|---|---|
| WO | 2008064717 A1 | 6/2008 |

*Primary Examiner* — Mariceli Santiago
*Assistant Examiner* — Donald Raleigh
(74) *Attorney, Agent, or Firm* — Mark L. Beloborodov (57) ABSTRACT

A segmented electroluminescent device (100) with resistive interconnect layers (102), each segment (104,104', 104") comprising an electroluminescent layer (110) arranged in between a first (106) and a second electrode (108) layer. The segments (104, 104', 104") are connected via resistive interconnect layers (102), the resistive interconnect layers having a larger square resistance than the second electrode layer. The resistive interconnect layers (102) add a ballast resistance to the electroluminescent device such that no additional electric ballast is needed. As the electric ballast is divided over multiple layers the problem of a heat management for the electric ballast becomes less important. By adding an isolation layer (122) the surface of the resistive interconnect layers (102) can be increased to almost the whole surface of the electroluminescent device (100). The system of the electrode layer (108), the isolating layer (122) and the resistive layer (102) functions as a capacitor.

15 Claims, 8 Drawing Sheets

SEGMENTED ELECTROLUMINESCENT DEVICE WITH RESISTIVE INTERCONNECT LAYERS

FIELD OF THE INVENTION

The present invention relates to the field of electroluminescent devices, and more particularly to organic light emitting diode (OLED) devices, and to the field of segmented illumination devices.

BACKGROUND AND RELATED ART

Electroluminescent devices comprise electroluminescent material that is capable of emitting light when a current is passed through it. The material used for electroluminescent devices can be light emitting polymers or small organic molecules. Organic devices may, for example be organic light emitting diodes (OLEDs), which are known in the art. For activating the electroluminescent devices, current is applied to the electroluminescent material by means of electrodes.

Electroluminescent devices, such as OLEDs, comprise electroluminescent material disposed between electrodes. Upon application of a suitable voltage, current flows through the electroluminescent material from anode to cathode. Light is produced by radiative recombination of holes and electrons inside the electroluminescent material.

Electroluminescent devices using organic electroluminescent material for general illumination have a forward voltage in the range of 2 to 5 Volts. This low voltage makes it unsuitable for direct mains driving. One solution of this problem is to connect as many OLED devices in series as it is required to achieve the required resistance of the electronic circuit. The problems with such kind of circuit are that the OLED peak current is much higher than the average value, the mains current harmonics might exceed regulation limits and the OLED average and peak current values vary greatly with the mains voltage variation.

Another possible solution is an electrical circuitry known as a ballast that is required to operate the OLED devices directly from mains. A ballast converts the AC voltage of the public power grid to a form which is suitable to drive an OLED light source at a prescribed brightness. Proposals to drive OLEDs directly from mains are known from prior art. These solutions are still too expensive to implement because additional circuit elements are required and extra effort for heat management is required. This is primarily due to the lumped element nature of the prior art solutions.

The invention therefore aims to provide an improved electroluminescent device, especially an improved OLED device.

SUMMARY OF THE INVENTION

The present invention provides a segmented electroluminescent device as claimed in claim 1. Embodiments of the invention are given in the dependent claims.

In accordance with embodiments of the invention a segmented electroluminescent device is provided that has a plurality of segments each comprising a first electroluminescent layer being interposed between a first electrode layer and a second electrode layer. The first electrode layer is arranged on a first side of the first electroluminescent layer and the second electrode layer is arranged on the second side of the first electroluminescent layer. The second side is opposite to the first side of the first electroluminescent layer. The first and second electrode layers are arranged for supplying charges to the electroluminescent layer, i.e. the first electrode layer constituting the anode and the second electrode layer constituting the cathode of the segmented electroluminescent device. The first electrode layer consists of a transparent material, and the second electrode layer consists of an opaque material, such as a metal. Hence, the first electrode layer constitutes the transparent conductive (TCO) layer of the electroluminescent device. For example, the first electrode layer can consist of indium tin oxide (ITO). The second electrode, representing the cathode, is typically a highly reflecting good conducting metal such as aluminum or silver. The electrodes of two neighbouring electrodes are not directly connected.

The segmented electroluminescent device further comprises a resistive interconnect layer connecting two neighbouring segments. The resistive interconnect layer is adapted to connect an anode and a cathode of two neighbouring segments and, contrary to prior art, to add a ballast resistance. Therefore, the resistance of the resistive interconnect layer has to be higher than the resistance of aluminum or silver. In accordance with embodiments of the invention the resistive interconnect layer consists of an alloy film, a single metal film, a cermet film or a semiconductor film. The film must be of sufficient resistivity to realize the desired ballast value between two neighbouring segments.

The resistivity of a thin film is expressed by the square resistance defined as $R_{sq}=\rho/t$, where $\rho$ denotes the resistivity of the material and t its thickness. In principal, any value can be achieved, by $\rho$ decreasing the film thickness. There are, however, practical and theoretical limits, where the resulting resistance deviates from the above calculated formula using the bulk resistivity. The typical range of square resistance values for various resistive thin film sheet materials is in the range of 5 to 2000 Ohms.

Single metal films may be used as resistive sheet materials. To the Fuchs-Sondheimer theory the resistivity of a thin film $\rho_F$ can be substantially higher than the bulk resistivity $\rho_B$.

In accordance with an embodiment of the invention, the resistive interconnect layer is structured in order to increase its resistivity. This can be achieved by inserting gaps into the resistive interconnect layer. By varying the lateral gap size the effective resistance can be increased. Another option is to introduce slots. The resistive interconnect layer shaping can be achieved during deposition e.g. via properly designed shadow masks or after layer deposition by wet or dry etching or laser ablation. Another possibility is to use printing techniques where conducting paint is deposited onto the electroluminescent device.

In accordance with an embodiment of the invention, an isolation layer is added covering the surface of the second electrode layer except for a small strip on the distal end portion of the segment with respect to the connected neighbouring segment. Due to the fact that the second electrode layer is of low resistivity the interconnect layer has to be isolated from the cathode layer except for a small strip to become effective. The lateral resistance is essentially determined by the length L, width w and thickness t of the interconnect layer. Due to the lateral current flow a voltage drop appears across the resist layer. This voltage drop is to first order linear:

$$dV(x)=V_o*x/w,$$

where Vo denotes the voltage at x=w.

$V_o$ can be derived from the total current flowing through the electroluminescent device:

$V_o=I_o*R$ with $R=\rho*w*L/t$, $\rho$ denotes the resistivity of the interconnect material.

The three layers: second electrode layer, isolation, resistive interconnect behave not only resistive but capacitive as well.

This is because the second electrode layer and interconnect layer are separated by an isolation layer. To calculate the total effective capacitance $C_{eff}$ the lateral voltage variation has to be taken into account.

Assuming that the second electrode layer is a perfect conductor the lateral voltage is constant so that voltage across the isolation layer becomes: $V_{iso}(x)=V_o*x/w$.

The effective capacitance $C_{eff}$ is derived from the stored energy E with:

$$E = \frac{1}{2} \cdot C_{eff} \cdot V_o^2$$

Now observing the differential capacitance dC with $dC=\frac{1}{2}*E*L*dx/t$ the stored energy dE is:

$$dE = \frac{1}{2} \cdot dC \cdot V(x) = \frac{1}{2} \cdot \frac{\varepsilon \cdot L \cdot dx}{t} \cdot \left(V_o \cdot \frac{x}{w}\right)^2$$

Integrating with respect to x from x=0 to x=w gives the desired expression for the total stored energy:

$$E = \frac{1}{6} \cdot w \cdot \varepsilon \cdot \frac{L}{t} \cdot V_o^2$$

The effective capacitance is then $$C_{eff} = \frac{1}{3} \cdot C_o,$$

where $$C_o = \frac{\varepsilon \cdot L \cdot w}{t}.$$

The time constant of the RC-ballast circuit is then: $\tau=R*C$. The total ballast resistance is designed to meet the requirements for a direct connect of the electroluminescent device to the mains power. According to these requirements the resistivity and thickness for the interconnect layer have to be chosen.

EXAMPLE

Assuming a current voltage characteristic $v_d(i_d)$ for an OLED strip of size 30×300 sqmm with $$v_d = k_1 * \ln(i_d/k_2 + 1) + i_d * R_s,$$

where
$v_d$: voltage across OLED device
$i_d$: current flowing into OLED device
$k_1, k_2$: OLED device dependent constants
and typical values of:
$k_1$=0.22V
$k_2$=0.21 uA
$R_s$=0.16 Ohms
Further given are a sinusoidal mains voltage of 230 $V_{ac}$ with a frequency of 50 Hz.

To achieve an average current of 0.1 A for an OLED device with the above characteristic directly connected the specified mains, 65 segments are required with a ballast resistance of 3 Ohms per segment.

An OLED device using this material stack requires 65 segments to achieve an average current of 0.1 A when connected to a mains voltage of 230 $V_{ac}$ and a frequency of 50 Hz.

To calculate the required square resistance $R_{sq}$ for the resistive interconnect it will be assumed that the interconnect resistance is primarily determined by the segment width w, segment length L, segment thickness t and segment resistivity rho so that the following relation for the segment and the sheet resistance holds:

$$R = \frac{\rho \cdot w}{L \cdot th} = \rho \cdot \frac{w}{L} = 0.1 \cdot Rsq$$

Observing R=3 Ohms the required square resistance of the interconnect material is therefore $R_{sq}$=30 Ohms.

The resistive interconnect layer covers the whole surface of the isolation layer and is connected to the second electrode layer only at the small strip left by the isolation layer. The connection to the neighbouring segment is carried out in the same way as in the embodiment without the isolation layer. Hence, the resistive interconnect layer is spread over a bigger surface and almost the complete area of the segmented electroluminescent device can be used for heat management.

In this embodiment the isolation layer separates the second electrode layer from the resistive interconnect layer. This part of the segment functions as a capacitor. To achieve high capacitance values a material with high permittivity is preferred for the isolation layer. Examples are silicon nitride (6<$\epsilon$<9), silicon dioxide ($\epsilon$=3.9), silicon oxide ($\epsilon$=3.9), aluminum oxide ($\epsilon$=9) or a high-k material such as Hafnium oxide ($\epsilon$=40).

In accordance with an embodiment of the invention, the capacitance and resistance values are increased by using multiple composite layers, i.e. layers where isolation and resistive layers alternate each other on stack. With this method it is possible to increase the time constant of the circuit of the electroluminescent device to values which helps to reduce flicker for frequencies in the range of 50 to 60 Hz. Another positive effect of this embodiment is the improved device sealing because diffusion through pin holes is blocked.

BRIEF DESCRIPTION OF THE DRAWINGS

In the following embodiments of the invention are described in greater detail by way of example only making reference to the drawings in which.

DETAILED DESCRIPTION OF EMBODIMENTS

In the description same numbers are used for the same components of each segment 104. Components with the same numbers function and are produced in the same way.

Figure 1:
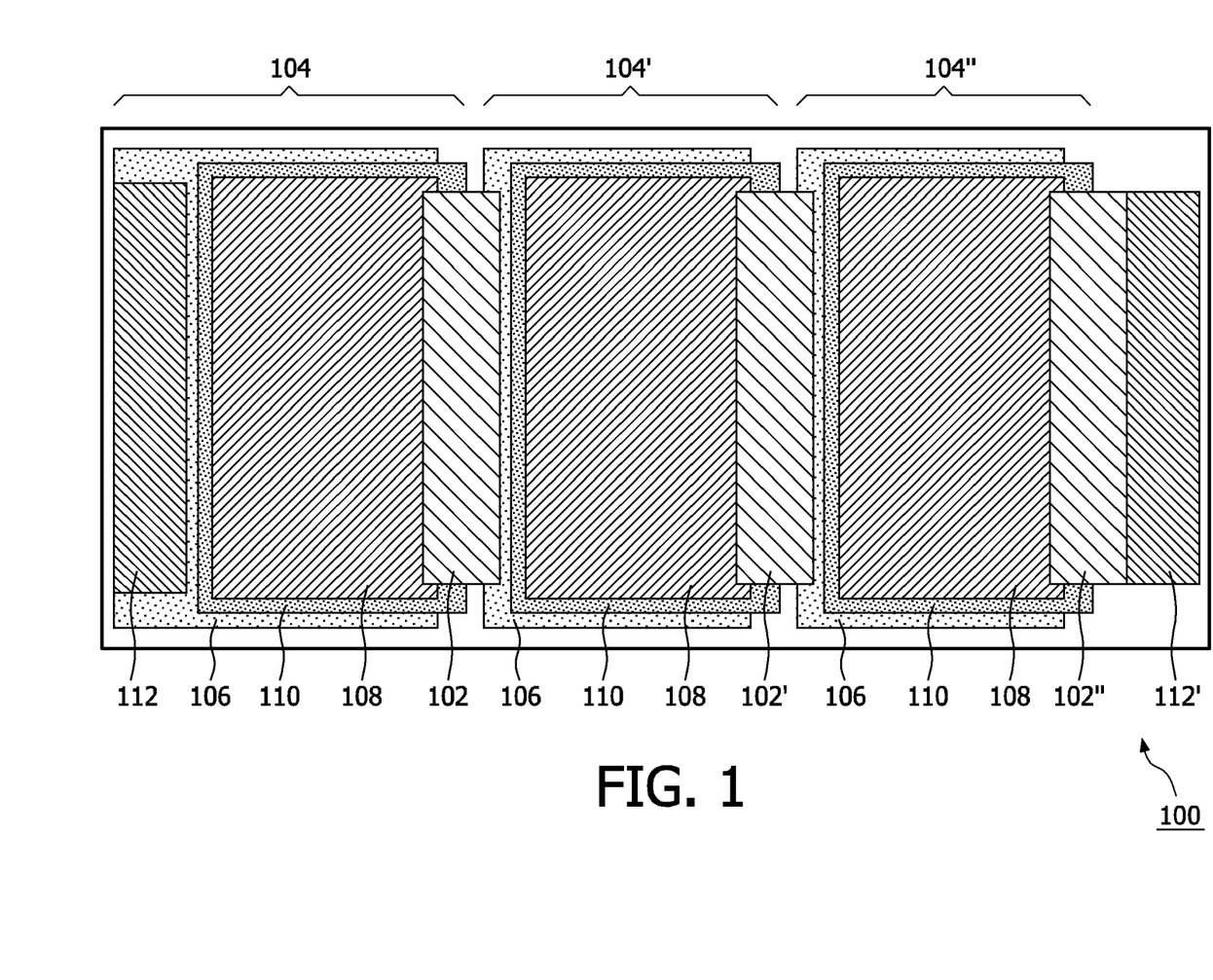
FIG. 1 is a top view of a 3-segment electroluminescent device in accordance with the invention.

FIG. 1 shows the top view of a three segment electroluminescent device 100 with integrated resistive interconnect layers 102. The electroluminescent device 100 consists of a plurality of segments 104. Each segment comprises two electrode layers 106, 108, anode and cathode, and an electroluminescent layer 110. The first electrode layer 106 of each segment 104 is arranged on the bottom side of the electroluminescent layer 110 and the second electrode layer is arranged on the opposite top side of the electroluminescent layer 110. The resistive interconnect layer 102 connects the second electrode layer 108 of one segment 104 with the first electrode layer 106 of a neighbouring segment 104'. On the two ends of the electroluminescent device 100 the terminals 112 are arranged to connect the electroluminescent device 100 to a power source.

The first electrode layers 106 are transparent conductive layers made of a transparent and conductive material such as ITO. The second electrode layers 108 are opaque and can be reflective in order to reflect light that is emitted from the electroluminescent layers when the current flows through the electroluminescent device 100. The light that is emitted from the electroluminescent layers 110 and which is reflected from the second electrode layers 108 is emitted through the first electrode layers 106.

By using a resistive interconnect layer 102 to connect the second electrode layer 108 of one segment 104 to the first electrode layer 106 of a neighbouring segment 104' the electric ballast that is required to connect the electroluminescent device 100 to a power source such as mains is distributed over several resistive interconnect layers 102 which reduces the effort for heat management.

The production of the resistive interconnect layers 102 seamlessly integrates into the production of electroluminescent devices by using the same technology.

Figure 2:
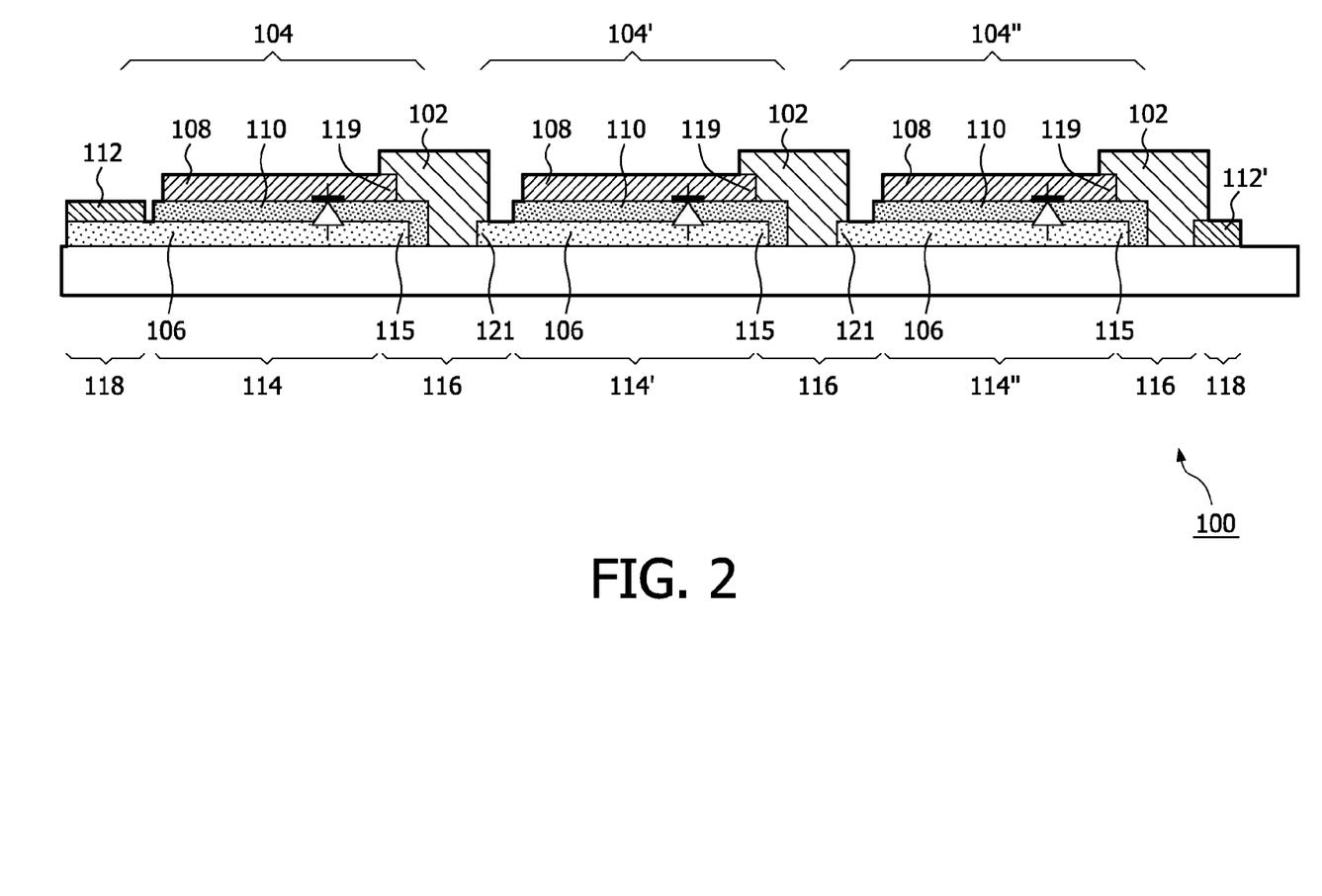
FIG. 2 is a cross section of the electroluminescent device of FIG. 1.

FIG. 2 shows the cross section of the electroluminescent device 100 of FIG. 1. The electroluminescent device 100 consists of a plurality of segments 104, 104', 104" and is divided in several portions 114, 116, 118. Each segment 104 represents a luminating portion 114. In between two neighbouring segments 104, 104' a gap portion 116 is arranged. On the two ends of the electroluminescent device the terminal portions 118 are arranged to connect the electroluminescent device 100 to a power source.

Each luminating portion 114 of the electroluminescent device 100 comprises two electrode layers 106, 108, anode and cathode, and an electroluminescent layer 110. The first electrode layer 106 of each segment 104 is arranged on the bottom side of the electroluminescent layer 110 and the second electrode layer 108 is arranged on the opposing top side of the electroluminescent layer 110. The electroluminescent layer 110 encloses the second end 115 of the first electrode layer 106 in order to prevent a connection of the second end 115 of the first electrode layer 106 with the resistive interconnect layer 102 that is arranged in the neighbouring gap portion 116. The resistive interconnect layer 102 connects a first end portion 119 of the second electrode layer 108 of one segment 104 to a first end portion 121 of the first electrode layer 106 of a neighbouring segment 104', each first end portion 119, 121 being proximal to the respective neighbouring segment 104, 104'.

Figure 3:
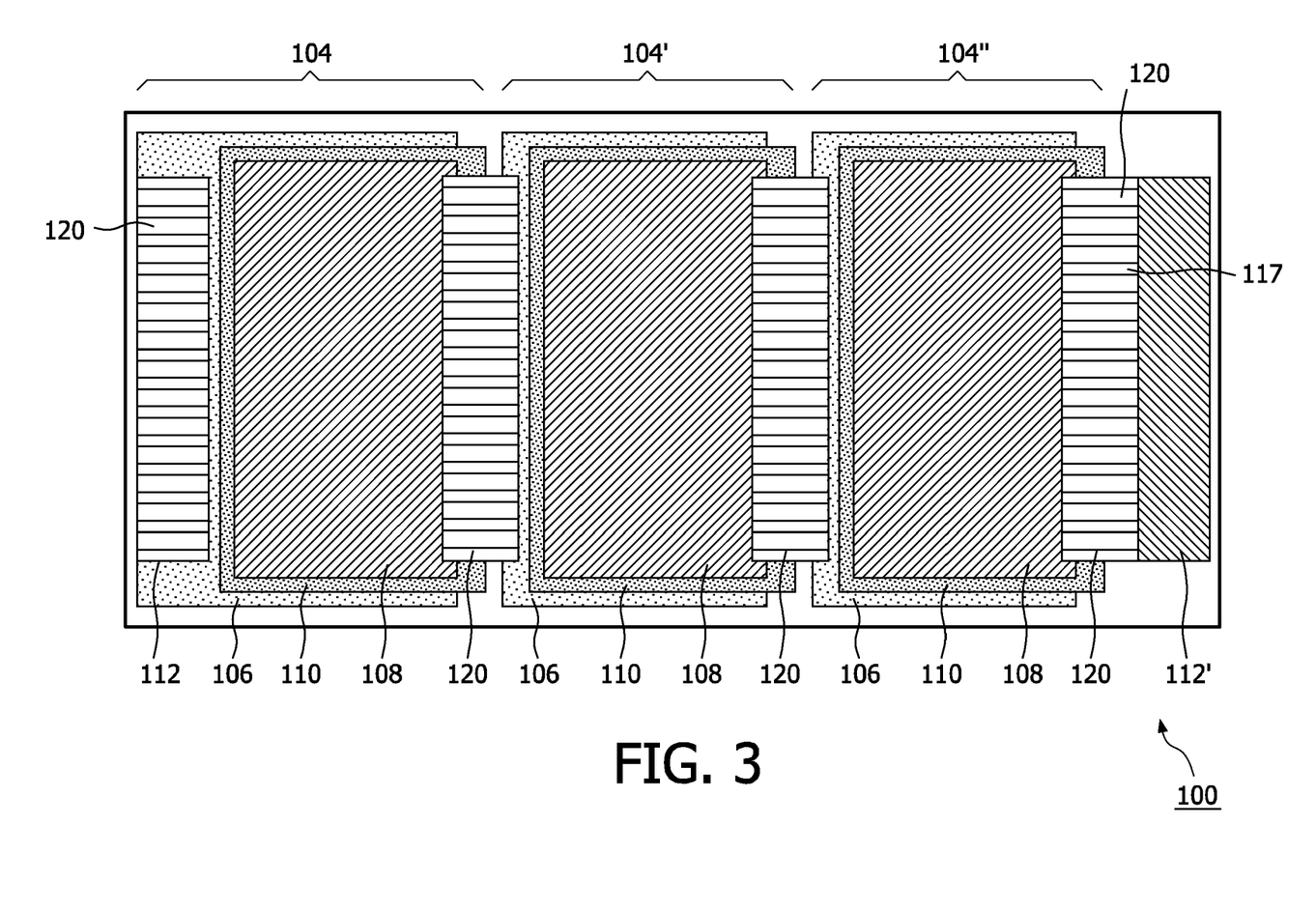
FIG. 3 is a top view of an electroluminescent device in accordance with the invention with structured interconnect layers.

FIG. 3 illustrates a three segment electroluminescent device 100 as in FIG. 1 with structured interconnect layers 120. The structure consists of several inserted gaps 117 or slots in order to increase the resistance. The shaping can be achieved during deposition.

Figure 4:
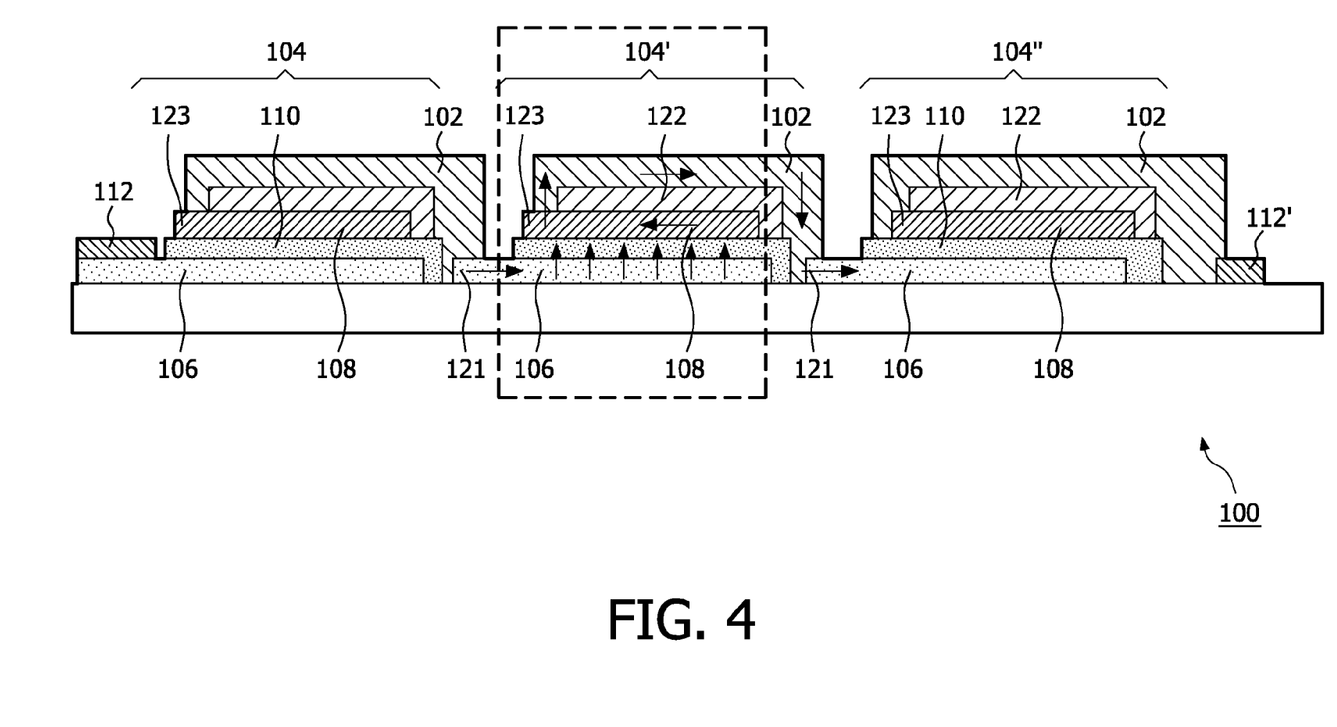
FIG. 4 is a cross section of an electroluminescent device in accordance with the invention comprising an isolating layer.

As can be seen from FIG. 4 an isolating layer 122 is added to each segment 104 of the electroluminescent device 100 from FIG. 2. Hence, the resistive interconnect layer 102 can be spread over a bigger surface connecting the second end 123 of the second electrode layer 108 to the first end 121 of the first electrode layer 106 of the neighbouring segment 104' without being short circuited by the second electrode layer 108, the second end 123 of the second electrode layer 108 being distal to the neighbouring segment 104'. The isolation layer 122 separates the resistive interconnect layer 102 from the second electrode layer 108. Thus, almost the complete area of the electroluminescent device 100 can be used for the resistive layer 102 and for the heat management. Due to the additional isolation layer 122 a capacitance between the resistive interconnect layer 102 and the second electrode layer 108 is effective.

Figure 5:
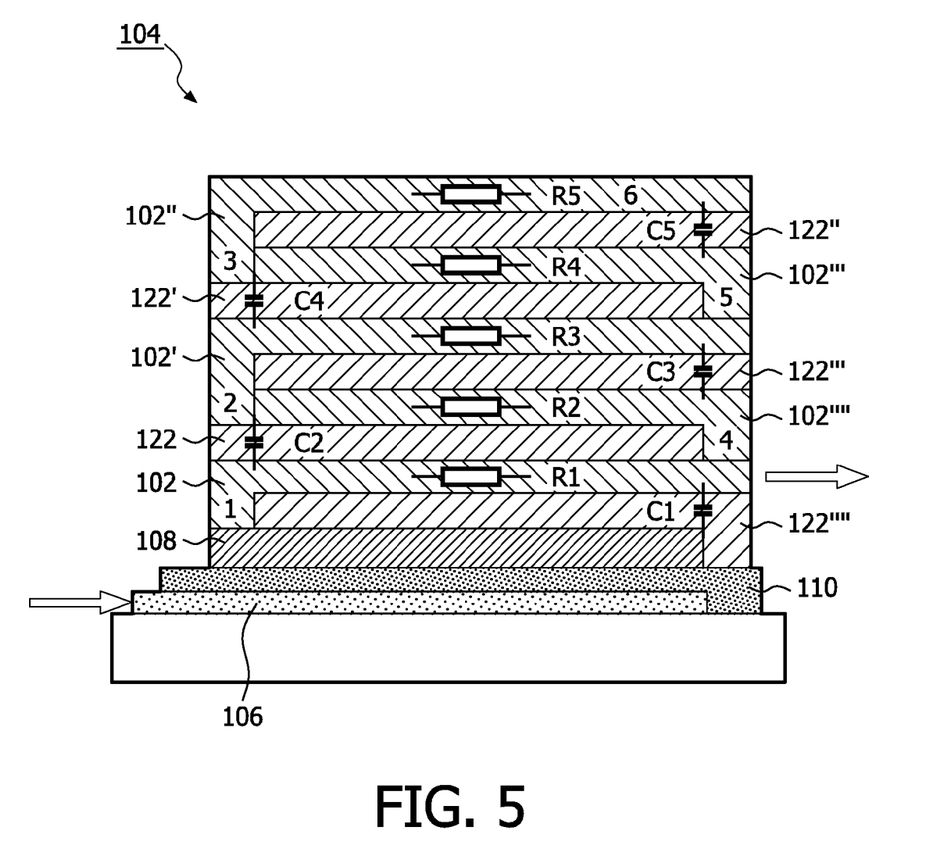
FIG. 5 is a detailed view of a single segment with multiple composite layers being used to increase the total resistance while the total capacitance is reduced.

FIG. 5 shows a detailed view of a single segment 104 of the electroluminescent device 100 with a multilayer interconnect. The isolation layers 122 and the resistive layers 102 alternate each other on stack. Each resistive layer 102 is connected with another one while the isolation layers 122 are separated by the resistive layers 102.

Figure 6:
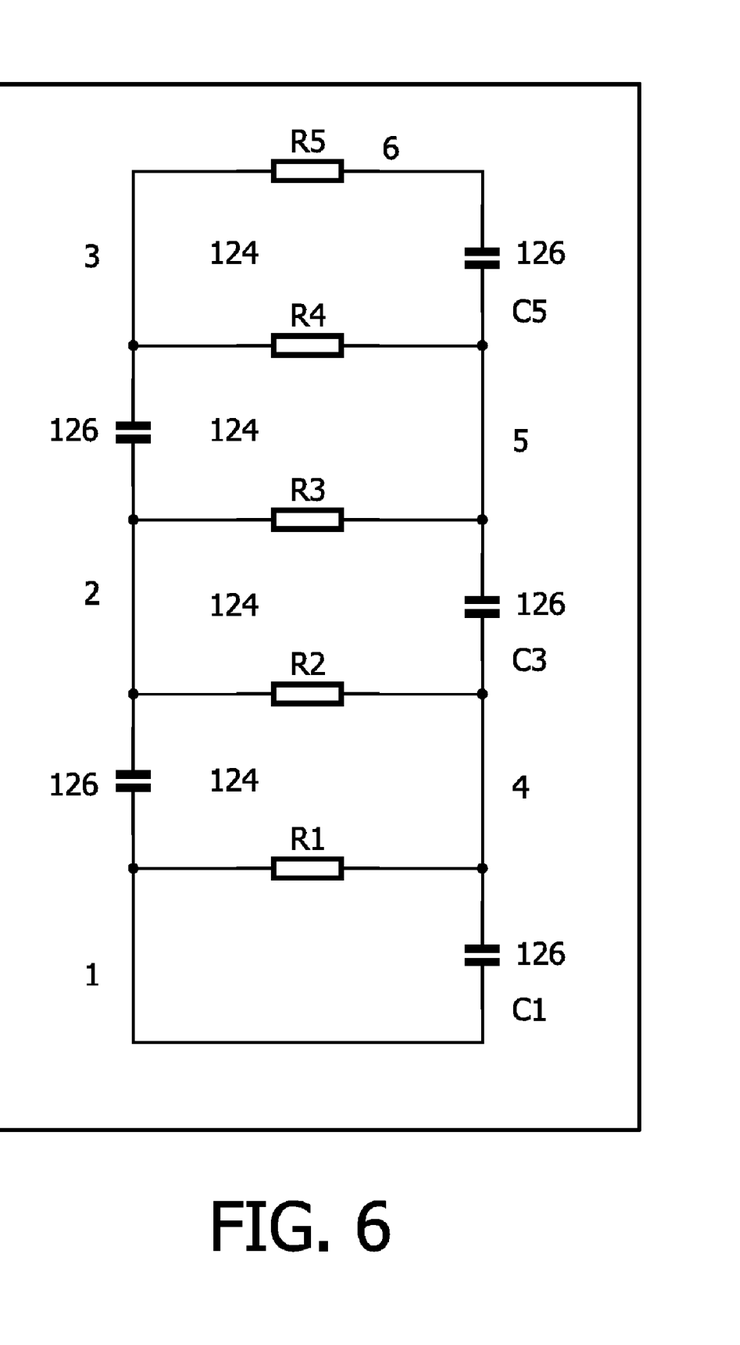
FIG. 6 is an equivalent circuit of the device shown in FIG. 5.

FIG. 6 shows the equivalent circuit scheme of the stacked segment 104 of FIG. 5. As can be seen the resistors 124 and capacitors 126 are effectively connected in series. Therefore the resistance is increased, the capacitance is decreased.

Figure 7:
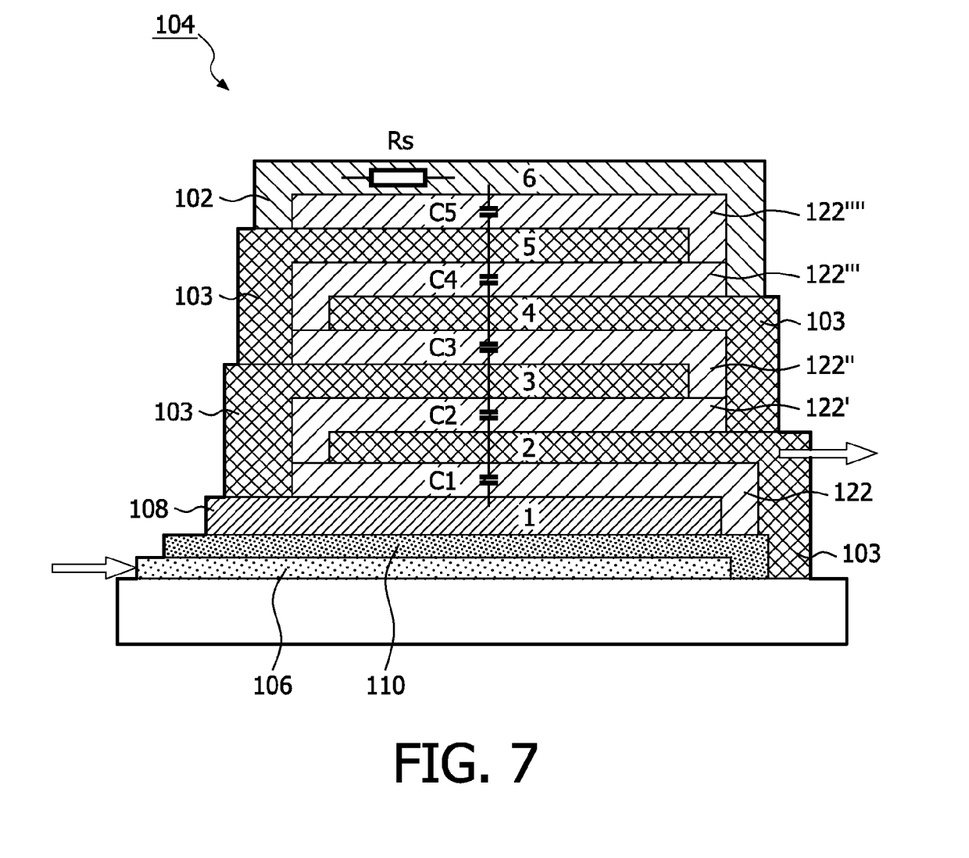
FIG. 7 is a detailed view of a single segment with multiple composite layers being used to increase the total resistance and the total capacitance.

In FIG. 7 another embodiment of a stacked segment 104 of the electroluminescent device 100 is shown. Each isolating layer 122 is connected in a meandering way to another isolating layer 122'. The conducting layers 103 encase the meandering way of the isolating layers 122. Branches of the conducting layers 103 extend into the meandering way of the isolating layers 122. On top of the segment 104 is a resistive interconnect layer 102 that connects two conducting layers 103.

The effect of the conducting layers 103 to the total resistance is negligible small compared to the effect of the resistive layer 102 on top of the segment. Therefore, the resistance of the conducting layers 103 is not important and can be of the same order of magnitude as the resistance of the resistive layer 102 or smaller.

Figure 8:
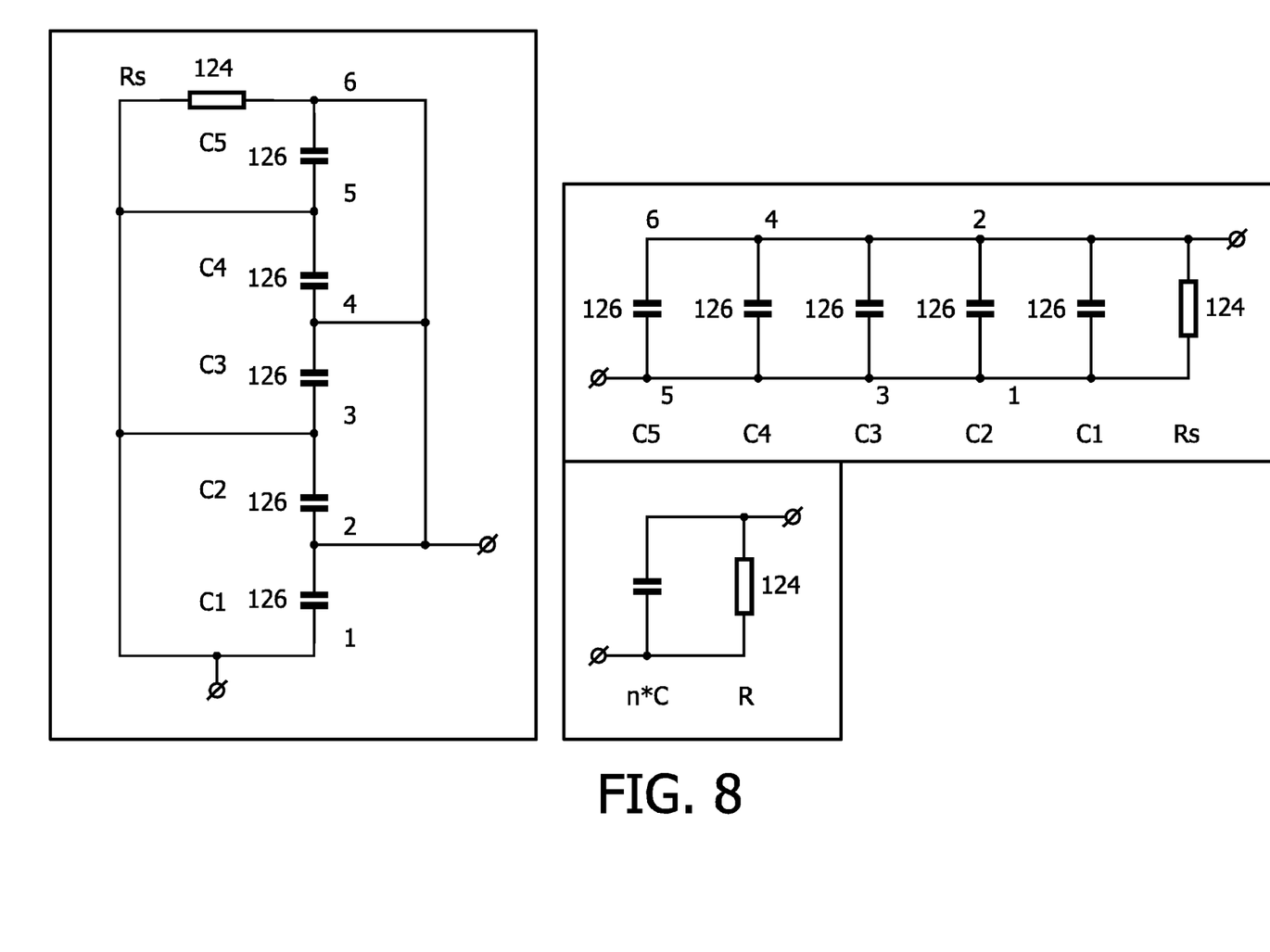
FIG. 8 is an equivalent circuit of the device shown in FIG. 7.

FIG. 8 shows the equivalent circuit scheme of FIG. 7. The resistor 124 represents the resistance of the resistive interconnect layer 102. The capacitors 126 are connected in parallel. Therefore, the capacitance increases. Hence, the time constant of the circuit of the electroluminescent device 100 is increased. With this method it is possible to increase the time constant of the circuit of the electroluminescent device 100 to values which help to reduce flicker for frequencies in the range of 50-60 Hz which is the frequency of mains power.

Embodiments of the electroluminescent device 100 are particularly advantageous as the resistive interconnect layers 102 can be used as a ballast resistor for directly coupling the electroluminescent device 100 to mains power.

In accordance with a further embodiment of the invention, the resistive interconnect layers 102 can be spread over almost the whole surface of the electroluminescent device being separated from the second electrode layer 108 by an isolating layer 122. Thus, no additional heat management is required. This system functions as a capacitor 126. The capacitance and the resistance can be increased by stacking several layers in an appropriate way.

LIST OF REFERENCE NUMERALS 100 electroluminescent device
102 resistive layer

102' resistive layer
102" resistive layer
102''' resistive layer
102'''' resistive layer
103 conducting layer
104 segment
104' segment
104" segment
106 first electrode layer
108 second electrode layer
110 electroluminescent layer
112 terminal
112' terminal
114 luminating portion
114' luminating portion
114" luminating portion
115 second end of the first electrode layer
116 gap portion
117 gap
118 terminal portion
119 first end of the second electrode layer
120 structured interconnect layer
121 first end of the first electrode layer
122 isolating layer
122' isolating layer
122" isolating layer
122''' isolating layer
122'''' isolating layer
123 second end of the second electrode layer
124 resistor
126 capacitor

The invention claimed is:

1. A segmented electroluminescent device comprising a plurality of segments, each segment comprising an electroluminescent layer with a first electrode layer arranged on a first side of the electroluminescent layer and a second electrode layer having a first square resistance arranged on a second side of the electroluminescent layer, and a resistive layer having a second square resistance, wherein the second square resistance is larger than the first square resistance, the resistive layer connecting a first one of the segments with a neighbouring second one of the segments, the resistive layer connecting the second electrode layer of the first one of the segments with the first electrode layer of the second one of the segments.

2. The electroluminescent device of claim 1, wherein the second square resistance is at least five times the first square resistance.

3. The electroluminescent device of claim 1, wherein the resistive layer is structured.

4. The electroluminescent device of claim 1, wherein the resistive layer is made of an alloy film, a single metal film, a semi-metal film, a cermet film or a semiconductor film.

5. The electroluminescent device of claim 1, wherein the resistive layer extends over the gap between the two neighbouring segments.

6. The electroluminescent device of claim 1, wherein the resistive layer connects a first end portion of the second electrode layer of the first segment to a first end portion of the first electrode layer of the second segment, wherein the first end portion is proximal with respect to the neighbouring segment.

7. The electroluminescent device of claim 1, wherein the resistive layer connects a second end portion of the second electrode layer of the first segment to the first end portion of the first electrode layer of the second segment, wherein the first end portion is proximal to the neighbouring segment and the second end portion is distal to the neighbouring segment.

8. The electroluminescent device of claim 1 with an isolating layer separating the second electrode layer from the resistive layer.

9. The electroluminescent device of claim 8, further comprising a contact surface between the second electrode layer and the resistive layer, the contact surface being located adjacent to the isolating layer.

10. The electroluminescent device of claim 8, wherein at least one of the segments comprises a plurality of isolation layers, conducting layers 103 and/or resistive layers, one of the resistive layers or conducting layers extending over the gap to the neighbouring segment.

11. The electroluminescent device of claim 10, wherein the isolation layers, conducting layers and/or resistive layers alternate each other on stack.

12. The electroluminescent device of claim 10, wherein at least two of the isolation layers are separated by one of the resistive layers or one of the conducting layers.

13. The electroluminescent device of claim 12, wherein at least one resistive layer is connected to at least one resistive layer.

14. The electroluminescent device of claim 10, wherein at least one isolation layer is connected to at least one isolation layer.

15. The electroluminescent device of claim 14, wherein at least one conducting layer is connected to at least one conducting layer.

* * * * *